US007713633B2

(12) United States Patent
Lingle et al.

(10) Patent No.: US 7,713,633 B2
(45) Date of Patent: May 11, 2010

(54) EMI FILTER FOR PLASMA DISPLAY PANEL

(75) Inventors: Philip J. Lingle, Temperance, MI (US);
Anton Dietrich, Fontnas (CH); Yiwei Lu, Ann Arbor, MI (US); Willem Den Boer, Brighton, MI (US); John A. Vanderploeg, Zeeland, MI (US); Yei-Ping (Mimi) H. Wang, Troy, MI (US)

(73) Assignees: Guardian Industries Corp., Auburn Hills, MI (US); Centre Luxembourgeois de Recherches pour le Verre et la Ceramique S.A. (C.R.V.C.), Grande Duche de Luxembourg (LU)

( * ) Notice: Subject to any disclaimer, the term of this patent is extended or adjusted under 35 U.S.C. 154(b) by 0 days.

(21) Appl. No.: 12/230,033

(22) Filed: Aug. 21, 2008

(65) Prior Publication Data
US 2009/0297864 A1 Dec. 3, 2009

Related U.S. Application Data

(60) Provisional application No. 61/071,936, filed on May 27, 2008.

(51) Int. Cl.
B32B 17/06 (2006.01)

(52) U.S. Cl. .......... 428/432; 428/428; 428/446; 428/448; 428/688; 428/689; 428/699; 428/701; 428/702

(58) Field of Classification Search .......... 428/426, 428/428, 432, 446, 448, 450, 688, 689, 699, 428/701, 702
See application file for complete search history.

(56) References Cited

U.S. PATENT DOCUMENTS

| 6,104,530 | A  | 8/2000 | Okamura et al. |
| 6,391,462 | B1 | 5/2002 | Jang |
| 6,576,349 | B2 | 6/2003 | Lingle et al. |
| 6,891,322 | B2 | 5/2005 | Lee et al. |

(Continued)

FOREIGN PATENT DOCUMENTS

EP         1 043 606        10/2000

(Continued)

OTHER PUBLICATIONS

International Search Report dated Aug. 21, 2009.
U.S. Appl. No. 61/071,936, filed May 27, 2008 (Lingle et al.).

*Primary Examiner*—Gwendolyn Blackwell
(74) *Attorney, Agent, or Firm*—Nixon & Vanderhye P.C.

(57) ABSTRACT

A plasma display panel (PDP) includes an EMI filter at a front portion thereof for blocking/shielding substantial amounts of electromagnetic waves. The filters has high visible transmission, and is capable of blocking/shielding electromagnetic waves. In certain example embodiments, a silver based coating of the EMI filter reduces damage from EMI radiation through highly conductive Ag layers, blocks significant amounts of NIR and IR radiation from outdoor sunlight to reduce PDP panel temperature, and enhances contrast ratio through reduced reflection, while maintaining high visible transmission. In certain example embodiments, at least one layer of or including silicon nitride may be Si-rich, and/or at least one layer including an oxide of Ni and/or Cr may be a suboxide, in order to improve heat treatability of the coated article.

13 Claims, 15 Drawing Sheets

U.S. PATENT DOCUMENTS

| | | |
|---|---|---|
| 7,255,980 B2 | 8/2007 | Hwang et al. |
| 7,344,782 B2 | 3/2008 | Lingle et al. |
| 2003/0150711 A1 | 8/2003 | Laird |
| 2004/0043226 A1 | 3/2004 | Laird et al. |
| 2004/0086723 A1* | 5/2004 | Thomsen et al. ............ 428/426 |
| 2006/0083938 A1 | 4/2006 | Kim et al. |
| 2007/0082219 A1* | 4/2007 | Fleury et al. ................ 428/656 |

FOREIGN PATENT DOCUMENTS

| | | |
|---|---|---|
| EP | 1 648 013 | 4/2006 |
| EP | 1 829 835 | 9/2007 |
| EP | 1 849 594 | 10/2007 |
| EP | 1 860 930 | 11/2007 |
| WO | WO 2005/086645 | 9/2005 |

\* cited by examiner

| # | Layer | | Thickness (nm) |
|---|---|---|---|
| 21 | SiNx o/c | 45 | 24.4 |
| 20 | SnO2 | 43 | 15.0 |
| 19 | NiCrOx-high | 41 | 1.0 |
| 18 | Ag | 39 | 16.8 |
| 17 | ZnO | 37 | 10.0 |
| 16 | SnO2 | 33 | 68.4 |
| 15 | NiCrOx-high | 31 | 1.0 |
| 14 | Ag | 29 | 18.2 |
| 13 | ZnO | 27 | 10.0 |
| 12 | TiO2 | 24 | 15.0 |
| 11b | SiNx Base | 26 | 12.0 |
| 11a | SiNx o/c | 25 | 20.2 |
| 10 | SnO2 | 23 | 12.0 |
| 9 | NiCrOx-high | 21 | 1.0 |
| 8 | Ag | 19 | 15.2 |
| 7 | ZnO | 17 | 10.0 |
| 6 | SnO2 | 13 | 68.4 |
| 5 | NiCrOx-high | 11 | 1.0 |
| 4 | Ag | 9 | 12.6 |
| 3 | ZnO | 7 | 10.0 |
| 2 | TiO2 | 4 | 15.0 |
| 1 | SiNx Base | 3 | 12.0 |
| | Glass | 1 | |

| | |
|---|---|
| total Ag | 62.7 |
| Total Dielectric | 302.5 |
| sheet resistance | 0.85 |

Fig. 1(a)

| | T% | CIE-C and 2 deg viewing | | | | | | Haze % | 850nm | | 950nm | | 1800nm | |
|---|---|---|---|---|---|---|---|---|---|---|---|---|---|---|
| | | a* | b* | L* | R% | a* | b* | L* | | T% | R% | T% | R% | T% | R% |
| As coated (on 2.8mm soda lime glass) | 62.5 | -3.5 | -3.6 | 83.2 | 7.0 | -1.7 | -1.9 | 31.9 | <1 | 3.6 | 46.9 | 0.7 | 58.8 | 0.0 | 82.2 |
| TCC on 2nd surface only | | | | | | | | | | | | | | | |
| AR on 1st surface & TCC on 2nd surface | 65.0 | -3.5 | -3.6 | 94.5 | 3.3 | -3.0 | -3.8 | 21.4 | <1 | 3.6 | 47.8 | 0.7 | 60.5 | 0.0 | 83.0 |

Fig. 9

| | CIE-C and 2 deg viewing | | | | 595nm | | 850nm | | 950nm | | 1800nm | |
|---|---|---|---|---|---|---|---|---|---|---|---|---|
| | T% | x' | y' | R% | Haze % | T% | R% | T% | R% | T% | R% | T% | R% |
| | 42.4 | 0.282 | 0.294 | 1.6 | <1 | 18.4 | 0.4 | 3.7 | 50.5 | 0.7 | 64.3 | 0.0 | 85.7 |
| AR on 1st surface, TCC on 2nd surface dye either between AR and TCC, or atop TCC | | | | | | | | | | | | | |

AS COATED
POST HT

| # | Layer | | Thickness (nm) |
|---|---|---|---|
| 25 | SiNx-HT | 45 | 25.3 |
| 24 | SnO2-HT | 43 | 12.0 |
| 23 | NiCrOx-HT | 41 | 1.5 |
| 22 | Ag | 39 | 14.2 |
| 21 | ZnO | 37 | 9.0 |
| 20 | SnO2-HT (Glue) | 13a' | 9.0 |
| 19 | SiNx-HT | 3a' | 12.0 |
| 18 | SnO2-HT | 33 | 49.6 |
| 17 | NiCrOx-HT | 31 | 1.5 |
| 16 | Ag | 29 | 13.6 |
| 15 | ZnO | 27 | 9.0 |
| 14 | SiNx Base HT | 26 | 12.0 |
| 13b | TiO2 | 24 | 9.0 |
| 13a | SiNx-HT | 25 | 26.2 |
| 12 | SnO2-HT | 23 | 12.0 |
| 11 | NiCrOx-HT | 21 | 1.5 |
| 10 | Ag | 19 | 12.1 |
| 9 | ZnO | 17 | 9.0 |
| 8 | SnO2-HT (Glue) | 13a | 9.0 |
| 7 | SiNx-HT | 3a | 12.0 |
| 6 | SnO2-HT | 13 | 46.3 |
| 5 | NiCrOx-HT | 11 | 1.5 |
| 4 | Ag | 9 | 10.0 |
| 3 | ZnO | 7 | 9.0 |
| 2 | SiNx Base HT | 3 | 12.0 |
| 1 | TiO2 | 4 | 9.8 |
| | Glass | 1 | |
| | | | 338.3 |
| | Total Ag | | 49.8 |
| | Total Dielectric | | 282.4 |

Pass 2 = layers 14–25
Pass 1 = layers 1–13a

Fig. 14

AS COATED
POST HT

| Layer | Ref | Thickness (nm) |
|---|---|---|
| SiNx-HT | 45 | 24.5 |
| SnO2-HT | 43 | 12.0 |
| NiCrOx-HT | 41 | 1.5 |
| Ag | 39 | 14.5 |
| ZnO | 37 | 10.0 |
| SnO2-HT (Glue) | 13a' | 10.0 |
| SiNx-HT | 3a' | 12.0 |
| SnO2-HT | 33 | 46.0 |
| NiCrOx-HT | 31 | 1.5 |
| Ag | 29 | 13.5 |
| ZnO | 27 | 10.0 |
| SiNx Base HT | 26 | 35.0 |
| SiNx-HT | 25 | 16.0 |
| SnO2-HT | 23 | 12.0 |
| NiCrOx-HT | 21 | 1.5 |
| Ag | 19 | 12.0 |
| ZnO | 17 | 10.0 |
| SnO2-HT (Glue) | 13a | 10.0 |
| SiNx-HT | 3a | 12.0 |
| SnO2-HT | 13 | 44.0 |
| NiCrOx-HT | 11 | 1.5 |
| Ag | 9 | 10.0 |
| ZnO | 7 | 10.0 |
| SiNx Base HT | 3 | 35.0 |
| Glass | 1 | |
| | | 364.5 |
| Total Ag | | 50.0 |
| Total Dielectric | | 308.5 |

Fig. 15

| Layer | | Thickness (nm) |
|---|---|---|
| SiNx-HT | 45 | 24.6 |
| SnO2-HT | 43 | 12.0 |
| NiCrOx-HT | 41 | 1.5 |
| Ag | 39 | 14.2 |
| ZnO | 37 | 10.0 |
| SnO2-HT (Glue) | 13a' | 8.0 |
| SiNx-HT | 3a' | 12.0 |
| SnO2-HT | 33 | 52.0 |
| NiCrOx-HT | 31 | 1.5 |
| Ag | 29 | 13.2 |
| ZnO | 27 | 10.0 |
| TiO2 | 24 | 12.0 |
| SiNx Base HT | 26 | 12.0 |
| SiNx-HT | 25 | 24.5 |
| SnO2-HT | 23 | 12.0 |
| NiCrOx-HT | 21 | 1.5 |
| Ag | 19 | 10.9 |
| ZnO | 17 | 10.0 |
| SnO2-HT (Glue) | 13a | 8.0 |
| SiNx-HT | 3a | 12.0 |
| SnO2-HT | 13 | 50.0 |
| NiCrOx-HT | 11 | 1.5 |
| Ag | 9 | 10.5 |
| ZnO | 7 | 10.0 |
| TiO2 | 4 | 12.5 |
| SiNx Base HT | 3 | 12.0 |
| Glass | 1 | |
| | | 358.3 |
| Total Ag | | 48.9 |
| Total Dielectric | | 303.5 |

Fig. 16

| Layer | Ref | Thickness (nm) |
|---|---|---|
| SiNx-HT | 45 | 24.6 |
| SnO2-HT | 43 | 12.0 |
| NiCrOx-HT | 41 | 1.0 |
| Ag | 39 | 16.0 |
| ZnO | 37 | 10.0 |
| SnO2-HT (Glue) | 13a' | 10.0 |
| SiNx-HT | 3a' | 12.0 |
| SnO2-HT | 33 | 48.4 |
| NiCrOx-HT | 31 | 1.0 |
| Ag | 29 | 15.0 |
| ZnO | 27 | 10.0 |
| SiNx Base HT | 26 | 35.0 |
| SiNx-HT | 25 | 16.0 |
| SnO2-HT | 23 | 12.0 |
| NiCrOx-HT | 21 | 1.0 |
| Ag | 19 | 14.0 |
| ZnO | 17 | 10.0 |
| SnO2-HT (Glue) | 13a | 10.0 |
| SiNx-HT | 3a | 12.0 |
| SnO2-HT | 13 | 50.5 |
| NiCrOx-HT | 11 | 1.0 |
| Ag | 9 | 11.0 |
| ZnO | 7 | 10.0 |
| SiNx Base HT | 3 | 35.0 |
| Glass | 1 | |
| | | 377.5 |
| Total Ag | | 56.0 |
| Total Dielectric | | 317.5 |

Fig. 17

| Layer | Ref | Thickness (nm) |
|---|---|---|
| SiNx-HT | 45 | 24.4 |
| SnO2-HT | 43 | 15.0 |
| NiCrOx-HT | 41 | 1.0 |
| Ag | 39 | 13.8 |
| ZnO | 37 | 10.0 |
| SnO2-HT | 33 | 66.4 |
| NiCrOx-HT | 31 | 1.0 |
| Ag | 29 | 15.2 |
| ZnO | 27 | 10.0 |
| TiO2 | 24 | 15.0 |
| SiNx Base HT | 26 | 12.0 |
| SiNx-HT | 25 | 16.2 |
| SnO2-HT | 23 | 12.0 |
| NiCrOx-HT | 21 | 1.0 |
| Ag | 19 | 12.2 |
| ZnO | 17 | 10.0 |
| SnO2-HT | 13 | 65.9 |
| NiCrOx-HT | 11 | 1.0 |
| Ag | 9 | 11.6 |
| ZnO | 7 | 10.0 |
| TiO2 | 4 | 15.0 |
| SiNx Base HT | 3 | 12.0 |
| Glass | 1 | |

Total Ag 52.7
Total Dielectric 293.9

Fig. 18

POST HT
AS COATED

| Layer | Ref | Thickness (nm) |
|---|---|---|
| SiNx-HT | 45 | 24.6 |
| SnO2-HT | 43 | 12.0 |
| NiCrOx-HT | 41 | 1.0 |
| Ag | 39 | 17.2 |
| ZnO | 37 | 10.0 |
| SnO2-HT (Glue) | 13a' | 12.0 |
| SiNx-HT | 3a' | 10.0 |
| SnO2-HT | 33 | 48.4 |
| NiCrOx-HT | 31 | 1.0 |
| Ag | 29 | 16.5 |
| ZnO | 27 | 10.0 |
| TiO2 | 24 | 5.0 |
| SiNx Base HT | 26 | 12.0 |
| SiNx-HT | 25 | 33.6 |
| SnO2-HT | 23 | 12.0 |
| NiCrOx-HT | 21 | 1.0 |
| Ag | 19 | 15.3 |
| ZnO | 17 | 10.0 |
| SnO2-HT (Glue) | 13a | 12.0 |
| SiNx-HT | 3a | 10.0 |
| SnO2-HT | 13 | 50.5 |
| NiCrOx-HT | 11 | 1.0 |
| Ag | 9 | 12.2 |
| ZnO | 7 | 10.0 |
| TiO2 | 4 | 10.0 |
| SiNx Base HT | 3 | 12.0 |
| Glass | 1 | |

Total Ag 61.2
Total Dielectric 304.1

Fig. 19

EMI FILTER FOR PLASMA DISPLAY PANEL

This application claims priority on provisional application No. 61/071,936, filed May 27, 2008, the entire disclosure of which is hereby incorporated herein by reference.

This invention relates to a plasma display panel (PDP) including a filter at a front portion thereof for blocking/shielding substantial amounts of electromagnetic waves. The filter has high visible transmission, and is capable of blocking/shielding electromagnetic waves.

BACKGROUND OF THE INVENTION

Image display devices are being widely used in a variety of applications, including TV screens, monitors of personal computers, etc. The plasma display panel (PDP) is gaining popularity as a next-generation display device to replace the CRT because a PDP is thin and a large screen can be readily fabricated with a plurality of units. A PDP includes a plasma display panel on which an image is displayed using a gas discharge phenomenon, and exhibits superior display capabilities, including high display capacity, high brightness, high contrast, clear latent image, a wide viewing angle, etc. In a PDP apparatus, when a direct current (DC) or alternating current (AC) voltage is applied to electrodes, a discharge of gas plasma is created, resulting in the emission of ultraviolet (UV) light. The UV emission excites adjacent phosphor materials, resulting in electromagnetic emission of visible light. Despite the above advantages, PDPs face several challenges associated with driving characteristics, including an increase in electromagnetic wave radiation, near-infrared emission, and phosphor surface reflection, and an obscured color purity due to orange light emitted from helium (He), neon, or xenon (Xe) used as a sealing gas.

Some believe that the electromagnetic waves and near-infrared rays generated in PDPs may adversely affect human bodies and cause malfunctions of precision machines such as wireless telephones or remote controllers (e.g., see US 2006/0083938, incorporated herein by reference). These waves, taken individually or collectively, may be referred to as electromagnetic interference (EMI). Thus, in order to make use of such PDPs, there is a desire to reduce the electromagnetic waves and near-infrared (IR or NIR) rays emitted from the PDPs to a predetermined level or less. In this respect, various PDP filters have been proposed for shielding electromagnetic waves or near-infrared rays emitted from the PDPs, reducing reflection of light and/or enhancing color purity. The proposed PDP filters are also required to meet transmittance requirements because the filters are installed on a front surface of each of the PDPs.

In order to reduce the electromagnetic waves and NIR waves emitted from plasma display panels to a predetermined level or less, various PDP filters have been used for the purposes of e.g., shielding electromagnetic waves or NIR emitted from the PDPs, reducing reflection of light and/or enhancing color purity. High transmittance is required for such filters because they are generally applied to the front surface of PDPs. Typical electromagnetic wave shielding filters meeting such requirements and characteristics are classified into a metal mesh-pattern filter and a transparent conductive film filter. Although the metal mesh-pattern filter exhibits a good electromagnetic wave shielding effect, it has several disadvantages including poor transmittance, image distortion, and an increase in the production cost due to a costly mesh. Due to such disadvantages, electromagnetic wave shielding filters using transparent conductive films using indium tin oxide (ITO) are being widely used instead of the metal mesh-pattern filter. The transparent conductive film is generally formed of a multi-level thin film structure in which a metal film and a high-refractive-index transparent thin layer are sandwiched. Silver or a silver-based alloy may be used as the metal film. However, convention PDP EMI filters tend to lack durability and/or can stand to be improved upon with respect to visible transmission and/or shielding properties.

Moreover, certain PDP EMI filters need to be heat treated (e.g., thermally tempered). Such heat treatment typically requires use of temperature(s) of at least 580 degrees C., more preferably of at least about 600 degrees C. and still more preferably of at least 620 degrees C. The terms "heat treatment" and "heat treating" as used herein mean heating the article to a temperature sufficient to achieve thermal tempering and/or heat strengthening of the glass inclusive article. This definition includes, for example, heating a coated article in an oven or furnace at a temperature of least about 580 degrees C., more preferably at least about 600 degrees C., for a sufficient period to allow tempering and/or heat strengthening. In certain instances, the HT may be for at least about 4 or 5 minutes. The use of such high temperatures (e.g., for 5-10 minutes or more) often causes coatings to break down and/or causes one or more of the aforesaid desirable characteristics to significantly deteriorate in an undesirable manner. Conventional PDP EMI filters tend to suffer from a lack of thermal stability and/or durability upon heat treatment (HT). In particular, heat treatment tends to cause conventional PDP filters to break down.

In view of the above, there exists a need in the art for an improved PDP filter which is improved (with respect to conventional PDP EMI filters) with respect to one or more of: (i) improved chemical durability, (ii) improved thermal stability (e.g., upon optional heat treatment such as tempering), (iii) improved visible transmission, and/or (iv) improved EMI shielding properties.

BRIEF SUMMARY OF EXAMPLE EMBODIMENTS OF THE INVENTION

In certain example embodiments of this invention, a plasma display panel (PDP) includes a filter at a front portion thereof for blocking/shielding substantial amounts of electromagnetic waves. The filters has high visible transmission, and is capable of blocking/shielding electromagnetic waves. In certain example embodiments, a silver based coating of the EMI filter reduces damage from EMI radiation through highly conductive Ag layers, blocks significant amounts of NIR and IR radiation from outdoor sunlight to reduce PDP panel temperature, and enhances contrast ratio through reduced reflection, while maintaining high visible transmission.

In certain example embodiments of this invention, there is provided a plasma display device comprising: a plasma display panel (PDP); an electromagnetic interference (EMI) filter provided at a front portion of the plasma display panel, the EMI filter including an EMI coating supported by a glass substrate, the EMI coating including the following layers moving away from the glass substrate: a first layer comprising silicon nitride; a first high index layer having a refractive index (n) of at least about 2.2; a first layer comprising zinc oxide; a first EMI shielding layer comprising silver contacting the first layer comprising zinc oxide; a first layer comprising an oxide of Ni and/or Cr contacting the first EMI shielding layer comprising silver; a first metal oxide layer; a second layer comprising zinc oxide; a second EMI shielding layer comprising silver contacting the second layer comprising zinc oxide; a second layer comprising an oxide of Ni and/or Cr contacting the second EMI shielding layer comprising silver; a second metal oxide layer; a third layer comprising zinc oxide; a third EMI shielding layer comprising silver contacting the third layer comprising zinc oxide; a third layer comprising an oxide of Ni and/or Cr contacting the third EMI shielding layer comprising silver; a third metal oxide layer; and an overcoat layer.

In other example embodiments of this invention, there is provided EMI filter for a display device, the EMI filter comprising: an EMI coating supported by a glass substrate, the EMI coating including the following layers moving away from the glass substrate: a first layer comprising zinc oxide; a first EMI shielding layer comprising silver contacting the first layer comprising zinc oxide; a first layer comprising an oxide of Ni and/or Cr contacting the first EMI shielding layer comprising silver; a second layer comprising zinc oxide; a second EMI shielding layer comprising silver contacting the second layer comprising zinc oxide; a second layer comprising an oxide of Ni and/or Cr contacting the second EMI shielding layer comprising silver; a third layer comprising zinc oxide; a third EMI shielding layer comprising silver contacting the third layer comprising zinc oxide; a third layer comprising an oxide of Ni and/or Cr contacting the third EMI shielding layer comprising silver; and an overcoat layer; wherein the third EMI shielding layer comprising silver is thicker than the first and/or second EMI shielding layers comprising silver.

plasma display device comprising: a plasma display panel; an electromagnetic interference (EMI) filter provided at a front portion of the plasma display panel, the EMI filter including an EMI coating supported by a glass substrate, the EMI coating including the following layers moving away from the glass substrate: a first layer comprising silicon nitride; a first layer comprising zinc oxide; a first EMI shielding layer comprising silver contacting the first layer comprising zinc oxide; a first layer comprising an oxide of Ni and/or Cr contacting the first EMI shielding layer comprising silver; a first metal oxide layer; a second layer comprising zinc oxide; a second EMI shielding layer comprising silver contacting the second layer comprising zinc oxide; a second layer comprising an oxide of Ni and/or Cr contacting the second EMI shielding layer comprising silver; a second metal oxide layer; a third layer comprising zinc oxide; a third EMI shielding layer comprising silver contacting the third layer comprising zinc oxide; a third layer comprising an oxide of Ni and/or Cr contacting the third EMI shielding layer comprising silver; a third metal oxide layer; an overcoat layer; and wherein the third layer comprising an oxide of Ni and/or Cr is less oxided than is/are one or both of the first and/or second layers comprising an oxide of Ni and/or Cr.

In certain example embodiments, the first layer comprising silicon nitride comprises $Si_xN_y$ layer(s), where x/y is from 0.76 to 1.5 (more preferably from about 0.85 to 1.2).

BRIEF DESCRIPTION OF THE DRAWINGS

FIG. 1(*b*) is a cross sectional view of a PDP panel including an EMI filter (e.g., the filter of any embodiment herein) according to an example embodiment of this invention.

FIG. 9 is a table listing example optical characteristics of filter structures of certain example embodiments of this invention.

FIG. 14 is a cross sectional view of an EMI filter for a display panel (e.g. PDP panel) according to another example embodiment of this invention.

FIG. 15 is a cross sectional view of an EMI filter for a display panel (e.g. PDP panel) according to another example embodiment of this invention.

FIG. 16 is a cross sectional view of an EMI filter for a display panel (e.g. PDP panel) according to another example embodiment of this invention.

FIG. 17 is a cross sectional view of an EMI filter for a display panel (e.g. PDP panel) according to another example embodiment of this invention.

FIG. 18 is a cross sectional view of an EMI filter for a display panel (e.g. PDP panel) according to another example embodiment of this invention.

FIG. 19 is a cross sectional view of an EMI filter for a display panel (e.g. PDP panel) according to another example embodiment of this invention.

DETAILED DESCRIPTION OF EXAMPLES OF THE INVENTION

Figure 1B:
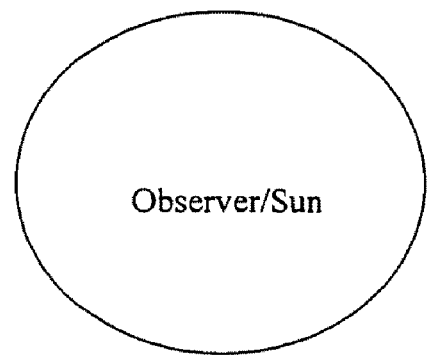
FIG. 1 (*a*) is a cross sectional view of an EMI filter for a display panel (e.g. PDP panel) according to an example embodiment of this invention.

Referring now more particularly to the accompanying drawings in which like reference numerals indicate like parts/layers throughout the several views.

A plasma display panel (PDP) includes a filter at a front portion thereof for blocking/shielding substantial amounts of electromagnetic waves. The filter has high visible transmission, and is capable of blocking/shielding substantial portions of electromagnetic waves. Certain example embodiments of this invention relate to an Ag-based multiple layered transparent conductive coating (TCC) for display applications (e.g., PDP applications). This EMI filter coating includes three or more Ag based layers sandwiched between metal oxides, nitrides or oxynitrides. It provides the functions of blocking EMI radiation and minimizing/reducing near infrared and infrared transmissions. The Ag based transparent conductive coating can be manufactured by magnetron sputtering on glass in certain example embodiments. The coating on glass may go through a post heat-treatment in a typical oven or tempering furnace to enhance glass strength and increase coating conductivity and transparency in certain example embodiments (i.e., heat treatment). In certain example embodiments, the Ag-based TCC (or EMI filter) coating includes or consists of four layers of ZnOx/Ag/NiCrOx sandwiched between metal oxides and nitrides. In certain example embodiments, the metal oxides (e.g., tin oxide, zinc oxide) and nitrides (e.g., silicon nitride) used have refractive indices (n) in visible higher than 1.8, and can be nonconductive such as SiNx or conductive such as ZnAlOx. In certain example embodiments, certain of the materials (e.g., Ag, zinc oxide based layers, and NiCrOx based layers) are the same for all three or four stacks, but the thickness of the dielectric and Ag layers are adjusted to meet the sheet resistance and optics targets for each of the layer stacks. Moreover, other layers may differ from stack to stack in order to enhance durability and optical performance. In certain example embodiments, the EMI filter may also include a conductive frit frame around the periphery to provide a low conductance contact to the housing of the plasma TV. The completed filter may also include AR coating film laminated to the front surface to reduce display reflectance and a laminate with a purple and/or pink dye attached to the back of the coated glass to improve color performance of the plasma TV.

FIG. 1(a) is a cross sectional view of an EMI filter for use in a PDP panel (or other type of display panel) according to an example embodiment of this invention. FIG. 1(b) is a cross sectional view illustrating the filter of FIG. 1(a) on a PDP panel. As shown in FIG. 1(b), the filter of FIG. 1(a) is provided on the interior side (side facing away from the sun) of a front cover glass substrate at the front of the PDP. The EMI filters according to example embodiments of this invention may or may not be used in conjunctions with antireflection (AR) coatings. An AR coating may be provided on the cover glass, on the opposite or the same side as the EMI filter coating. The PDP panel 40 shown in FIG. 1(b) may be any suitable type of PDP panel. Example PDP panels are described in US 2006/0083938 (e.g., see FIG. 6), the entirety of which is incorporated herein by reference. For purposes of example, the FIG. 1(a) filter structure may be used in place of 100 or 100' in the PDP device of FIG. 6 of US 2006/0083938, as an example application of this invention.

Figure 1B:
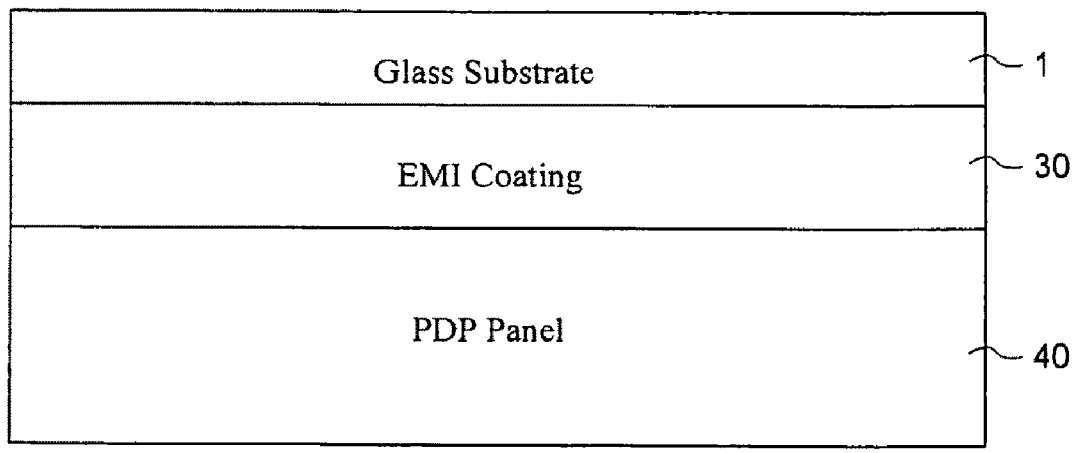

The EMI filter structure of FIG. 1 includes cover glass substrate 1 (e.g., clear, green, bronze, or blue-green glass substrate from about 1.0 to 10.0 mm thick, more preferably from about 1.0 mm to 3.5 mm thick), and EMI filter coating (or layer system) 30 provided on the substrate 1 either directly or indirectly. The coating (or layer system) 30 includes: dielectric silicon nitride base layer 3 which may be $Si_3N_4$, of the Si-rich type for haze reduction, or of any other suitable stoichiometry in different embodiments of this invention, high index titanium oxide inclusive layer 4, first lower contact layer 7 (which contacts conductive EMI shielding layer 9), first conductive and preferably metallic EMI shielding layer 9, first upper contact layer 11 (which contacts layer 9), dielectric or conductive metal oxide layer 13 (which may be deposited in one or multiple steps in different embodiments of this invention), second lower contact layer 17 (which contacts EMI shielding layer 19), second conductive and preferably metallic EMI shielding layer 19, second upper contact layer 21 (which contacts layer 19), dielectric or conductive metal oxide layer 23, dielectric silicon nitride based layer(s) 25, 26 which may be $Si_3N_4$, of the Si-rich type for haze reduction, or of any other suitable stoichiometry in different embodiments of this invention, second high index titanium oxide inclusive layer 24, third lower contact layer 27 (which contacts conductive EMI shielding layer 29), third conductive and preferably metallic EMI shielding layer 29, third upper contact layer 31 (which contacts layer 29), dielectric or conductive metal oxide layer 33 (which may be deposited in one or multiple steps in different embodiments of this invention), fourth lower contact layer 37 (which contacts EMI shielding layer 39), fourth conductive and preferably metallic EMI shielding layer 39, fourth upper contact layer 41 (which contacts layer 39), dielectric or conductive metal oxide layer 43, and protective overcoat layer 45 of or including silicon nitride or the like. The "contact" layers 7, 11, 17, 21, 27, 31, 37 and 41 each contact at least one EMI shielding/reflecting layer (e.g., layer based on Ag) (9, 19, 29, 39). The aforesaid layers 3-45 make up the EMI shielding coating 30 which is provided on substrate 1 for blocking substantial amounts of EMI from being emitted from the PDP device. Example sheet resistances are 0.8, 1.2 and 1.6 ohm/sq. for the coatings 30 in different example embodiments. In certain example embodiments, the coating 30 may have a sheet resistance of from about 0.5 to 1.8 ohms/sq.

An alternative (not shown) to the FIG. 1 embodiment involves splitting each of metal oxide layers 13 and 33 into two different layers and provided a silicon nitride based layer in between the split layers. In other words, for example, tin oxide based layer 13 would be replaced with a first tin oxide based layer 13', a silicon nitride layer 13" and a second tin oxide based layer 13'". Likewise, tin oxide based layer 33 would be replaced with a first tin oxide based layer 33', a silicon nitride layer 33" and a second tin oxide based layer 33'". This alternative layer stack is particularly advantageous with respect to heat treated and heat treatable filters that may be used when, for example, bus bar/black frit is applied on top of the coating 30. In such embodiments, the use of the NiCrOx material for layers 11, 21, 31 and 41 is advantageous in that it is more durable and provides for better thermal stability compared to other possible materials such as zinc oxide or zinc aluminum oxide.

Dielectric layers 3, 25, 26 and 45 preferably have a refractive index (n) of from about 1.9 to 2.1, more preferably from about 1.97 to 2.08, and may be of or include silicon nitride in certain embodiments of this invention. Silicon nitride layers 3, 3a, 25, 26 and 45 may, among other things, improve heat-treatability of the coated articles, e.g., such as thermal tempering or the like. The silicon nitride of one, two or all of these layers may be of the stoichiometric type ($Si_3N_4$) type, or alternatively of the Si-rich type in different embodiments of this invention. For example, Si-rich silicon nitride 3, 3a, 26 combined with zinc oxide inclusive layer 7 (and/or 27) under a silver based EMI shielding layer 9 (and/or 29) may permit the silver to be deposited (e.g., via sputtering or the like) in a manner which causes its sheet resistance to be lessened compared to if certain other material(s) were under the silver (and thus, EMI shielding to be improved). Moreover, the presence of free Si in a Si-rich silicon nitride inclusive layer 3 and/or 3a may allow certain atoms such as sodium (Na) which migrate outwardly from the glass 1 during HT to be more efficiently stopped by the Si-rich silicon nitride inclusive layer before they can reach the silver and damage the same. Thus, it is believed that the oxidation caused by heat treatment allows visible transmission to increase, and that the Si-rich $Si_xN_y$ can reduce the amount of damage done to the silver layer(s) during HT in certain example embodiments of this invention thereby allowing sheet resistance ($R_s$) to decrease in a satisfactory manner and EMI shielding to be improved. In certain example embodiments, when Si-rich silicon nitride us used in layer(s) 3, 3a, and/or 25, 26, the Si-rich silicon nitride layer as deposited may be characterized by $Si_xN_y$ layer(s), where x/y may be from 0.76 to 1.5, more preferably from 0.8 to 1.4, still more preferably from 0.85 to 1.2. Moreover, in certain example embodiments, before and/or after HT the Si-rich $Si_xN_y$ layer(s) (e.g., 3 and/or 3a) may have an index of refraction "n" of at least 2.05, more preferably of at least 2.07, and sometimes at least 2.10 (e.g., 632 nm) (note: stoichiometric $Si_3N_4$ which may also be used has an index "n" of 2.02-2.04). In certain example embodiments, it has surprisingly been found that improved thermal stability is especially realizable when the Si-rich $Si_xN_y$ layer(s) as deposited has an index of refraction "n" of at least 2.10, more preferably of at least 2.2, and most preferably from 2.2 to 2.4. Also, the Si-rich $Si_xN_y$ layer in certain example embodiments may have an extinction coefficient "k" of at least 0.001, more preferably of at least 0.003 (note: stoichiometric $Si_3N_4$ has an extinction coefficient "k" of effectively 0). Again, in certain example embodiments, it has surprisingly been found that improved thermal stability can be realized when "k" for the Si-rich $Si_xN_y$ layer is from 0.001 to 0.05 as deposited (550 nm). It is noted that n and k tend to drop due to heat treatment. Any and/or all of the silicon nitride layers (3, 25, 26, 45) discussed herein may be doped with other materials such as stainless steel or aluminum in certain example embodiments of this invention. For example, any and/or all silicon nitride layers discussed herein may optionally include from about 0-15% aluminum, more preferably from about 1 to 10% aluminum, most preferably from 1-4% aluminum, in certain example embodiments of this invention. The silicon nitride may be deposited by sputtering a target of Si or SiAl in certain embodiments of this invention. These layers are provided in order to improve the reflection of EMI without sacrificing visible transmission.

High index layers 4 and 24 are preferably of or including an oxide of titanium (e.g., $TiO_2$, or other suitable stoichiometry) in certain example embodiments of this invention. Layers 4 and 24 preferably have a refractive index (n) of at least about 2.2, more preferably of at least about 2.3, 2.4 or 2.45, in certain example embodiments of this invention. These layers 4 and 24 may be conductive or dielectric in different example embodiments of this invention. These layers are provided in order to improve the reflection of EMI without sacrificing visible transmission.

EMI shielding/reflecting layers 9, 19, 29 and 39 are preferably substantially or entirely metallic and/or conductive, and may comprise or consist essentially of silver (Ag), gold, or any other suitable EMI reflecting material. EMI shielding layers 9, 19, 29 and 39 help allow the coating to have good conductivity and block EMI from being emitted from the PDP panel. It is possible for these layers to be slightly oxidized in certain embodiments of this invention.

The upper contact layers 11, 21, 31 and 41 maybe of or include nickel (Ni) oxide, chromium/chrome (Cr) oxide, or a nickel alloy oxide such as nickel chrome oxide ($NiCrO_x$), or other suitable material(s), in certain example embodiments of this invention. The use of, for example, $NiCrO_x$ in these layers allows durability to be improved. The $NiCrO_x$ of layers 11 and/or 21 may be fully oxidized in certain embodiments of this invention (i.e., fully stoichiometric), or alternatively may only be partially oxidized. In certain instances, the $NiCrO_x$ layers may be at least about 50% oxidized. These layers (e.g., of or including an oxide of Ni and/or Cr) may or may not be oxidation graded in different embodiments of this invention. Oxidation grading means that the degree of oxidation in the layer changes throughout the thickness of the layer so that for example a contact layer may be graded so as to be less oxidized at the contact interface with the immediately adjacent IR reflecting layer than at a portion of the contact layer(s) further or more/most distant from the immediately adjacent IR reflecting layer, and these contact layers may or may not be continuous in different embodiments of this invention across the entire IR reflecting layer. The use of the NiCrOx material for one, two, three or all of layers 11, 21, 31 and 41 is advantageous in that it is more durable and provides for better thermal stability compared to other possible materials such as zinc oxide or zinc aluminum oxide. This is especially the case with respect to heat treated and heat treatable filters that may be used when, for example, bus bar/black frit is applied on top of the coating 30 in certain applications.

Metal oxide layers 13, 23, 33 and 43 may be of or include tin oxide in certain example embodiments of this invention. These layers preferably have a refractive index (n) of from about 1.9 to 2.1 in certain example embodiments of this invention, more preferably from about 1.95 to 2.05. These layers may be doped with other material such as zinc in certain instances. However, as with other layers herein, other materials may be used in different instances. These layers are provided in order to improve the reflection of EMI without sacrificing visible transmission.

Lower contact layers 7, 17, 27 and 37 in certain embodiments of this invention are of or include zinc oxide (e.g., ZnO). The zinc oxide of these layers may contain other materials as well such as Al (e.g., to form $ZnAlO_x$). For example, in certain example embodiments of this invention, one or more of these zinc oxide layers may be doped with from about 1 to 10% Al, more preferably from about 1 to 5% Al, and most preferably about 2 to 4% Al. The use of zinc oxide under the silver 9, 19, 29, 39 allows for an excellent quality of silver to be achieved thereby improving conductivity and improving EMI shielding.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

In certain example embodiments of this invention, the Ag-based EMI shielding layers in the coating have different thicknesses. This is by design, and is particularly advantageous. The different thicknesses of the silver based layers 9, 19, 29, 39 are optimized to obtain a low visible reflection as seen from outside of the PDP apparatus (i.e., from the glass side of the film, in most embodiments, namely when the coating 30 is on the interior surface of the substrate 1 facing the plasma), and at the same time permitting high visible transmittance. Silver layers buried deeper in the stack (i.e., further from the plasma) are masked to a certain extent by the absorption in the preceeding layers; therefore, they can be made thicker to improve EMI shielding without adversely affecting outside reflectance to any significant extent. Thus, the thickness (physical thickness) of a silver based EMI shielding layer(s) (e.g., 39) further from the plasma of the PDP panel can be significantly thicker than the thickness of a silver based EMI shielding layer(s) (e.g., 9) closer to the plasma of the PDP panel. The total silver thickness is unevenly distributed across the coating 30 in order to take advantageous of this effect. The total thickness of all silver based layers (9, 19, 29, 39) combined may be from about 25-80 nm in certain example embodiments of this invention, more preferably from about 30-70 nm, whereas the total thickness of the entire coating 30 may be from about 300 to 400 nm, more preferably from about 325 to 380 nm, and most preferably from about 330 to 375 in certain example embodiments of this invention. In certain example embodiments, the thickness (physical thickness) of a silver based EMI shielding layer(s) (e.g., 39 or 29) further from the plasma of the PDP panel is at least about 1 nm thicker (more preferably at least about 2 nm thicker, and possibly at least about 3 or 4 nm thicker) than the thickness of a silver based EMI shielding layer(s) (e.g., 9) closer to the plasma of the PDP panel.

Figure 2:
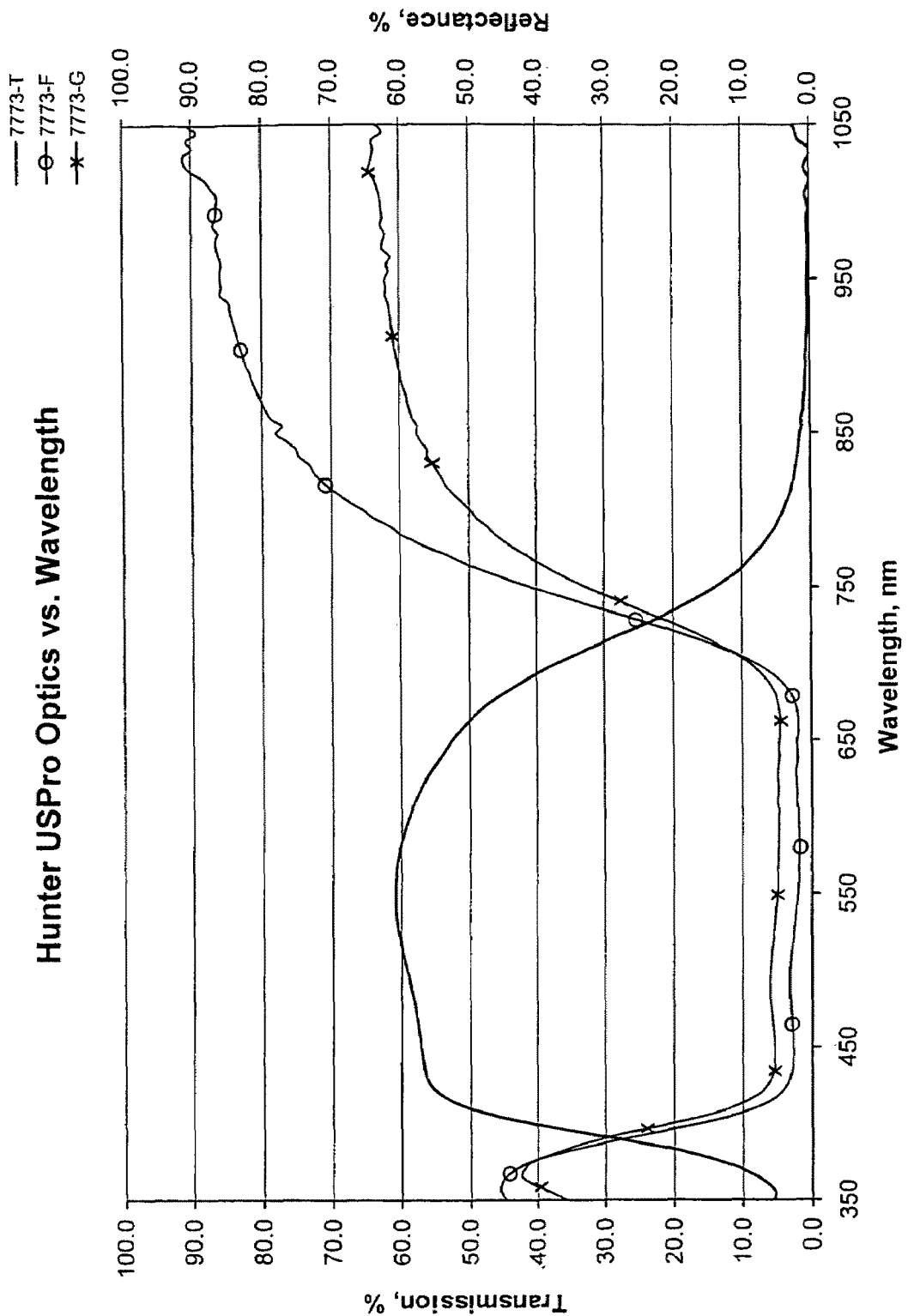
FIG. 2 is a transmission/reflectance vs. wavelength graph illustrating optical characteristics of the filter of FIG. 1(*a*) according to an example embodiment of this invention.

FIG. 2 is a transmission/reflectance vs. wavelength graph illustrating optical characteristics of the filter of FIG. 1(*a*) when designed for a sheet resistance of 0.8 ohms/square, thereby having thick silver layer(s). In FIG. 2, T stands for transmission, G stands for glass side reflectance, and F stands for film side reflectance. It can be seen in FIG. 2 that film side (i.e., the side closest to the plasma) reflectance of EMI such as NIR is enhanced (much reflectance) while visible transmission (e.g., from 450-650 nm) is kept high. This provides for a filter having good/high visible transmission, but much reflectance/absorption in the NIR region where undesirable wavelengths are present. In certain example embodiments, the combination of the coating 30 and the substrate 1 have a visible transmission of at least about 50%, more preferably of at least about 55%, 58% or 60% in certain example embodiments of this invention.

Figure 3:
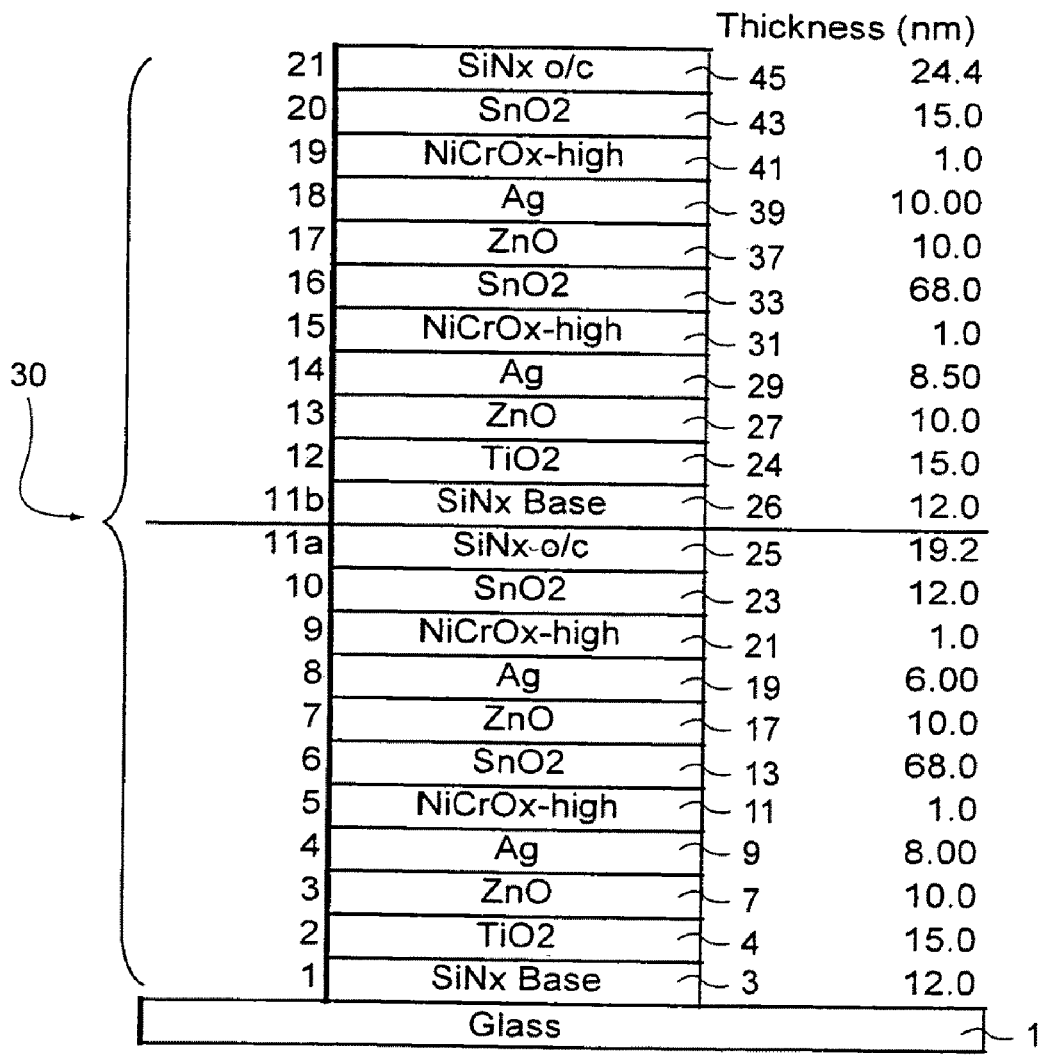
FIG. 3 is a cross sectional view of an EMI filter for a display panel (e.g. PDP panel) according to another example embodiment of this invention.

FIG. 3 is a cross sectional view of an EMI filter for a display panel (e.g. PDP panel) according to another example embodiment of this invention. The FIG. 3 embodiment is the same as the FIG. 1(*a*)-(*b*) embodiment discussed above, except that certain thicknesses are different because the FIG. 3 filter is designed for a higher sheet resistance (Rs of 1.64 ohms/square).

While various thicknesses and materials may be used in layers in different embodiments of this invention, example thicknesses and materials for the respective layers on the glass substrate 1 in the FIG. 1-3 embodiments are as follows, from the glass substrate outwardly:

Example Materials/Thicknesses; FIG. 1-3 Embodiment

| Layer | Preferred Range (nm) | More Preferred (nm) | Example (nm) |
|---|---|---|---|
| Glass (1-10 mm thick) | | | |
| $Si_xN_y$ (layer 3) | 4-30 | 8-15 | 10-14 |
| $TiO_x$ (layer 4) | 4-35 | 8-20 | 15 |
| $ZnO_x$ (layer 7) | 4-22 | 5-15 | 10 |
| Ag (layer 9) | 4-20 | 6-15 | 8-13 |
| $NiCrO_x$ (layer 11) | 0.3-4 | 0.5-2 | 1 |
| $SnO_2$ (layer 13) | 10-100 | 25-90 | 55-80 |
| $ZnO_x$ (layer 17) | 4-22 | 5-15 | 10 |
| Ag (layer 19) | 4-24 | 6-20 | 8-18 |
| $NiCrO_x$ (layer 21) | 0.3-4 | 0.5-2 | 1 |
| $SnO_2$ (layer 23) | 4-25 | 6-20 | 10-14 |
| $Si_3N_4$ (layer 25) | 10-50 | 12-40 | 15-25 |
| $Si_xN_y$ (layer 26) | 4-30 | 8-15 | 10-14 |

-continued

| Layer | Preferred Range (nm) | More Preferred (nm) | Example (nm) |
|---|---|---|---|
| $TiO_x$ (layer 24) | 4-35 | 8-20 | 15 |
| $ZnO_x$ (layer 27) | 4-22 | 5-15 | 10 |
| Ag (layer 29) | 8-30 | 10-24 | 12-22 |
| $NiCrO_x$ (layer 31) | 0.3-4 | 0.5-2 | 1 |
| $SnO_2$ (layer 33) | 10-100 | 25-90 | 55-80 |
| $ZnO_x$ (layer 37) | 4-22 | 5-15 | 10 |
| Ag (layer 39) | 8-30 | 10-24 | 11-20 |
| $NiCrO_x$ (layer 41) | 0.3-4 | 0.5-2 | 1 |
| $SnO_2$ (layer 43) | 4-25 | 6-20 | 10-18 |
| $Si_3N_4$ (layer 45) | 10-50 | 15-40 | 18-32 |

In another example embodiment of this invention, FIG. 4 describes an Ag based TCC coating for use as an EMI filter in PDP applications of the like as discussed above, the FIG. 4 coating 30 including four layer stacks of ZnOx/Ag/NiCrOx sandwiched between metal oxides and nitrides. The FIG. 4 coating has different thicknesses than the coating of FIGS. 1-3, and also in FIG. 4 the layers 3, 25, 26, 24, 43 from the FIG. 1-3 embodiments have been removed. This shows that all layers in the FIG. 1 embodiment are not essential, and some may be removed in certain instances. This FIG. 4 coating 30 may have a sheet resistance less than 1.5 ohm/sq and 1.0 ohm/sq measured as coated and after heat-treatment, respectively, in certain example embodiments, and a neutral transmission in visible higher than 55% or 60% in certain example embodiments. The sheet resistance can be further reduced through the trade-off of transmission in visible by increased Ag thickness. If a lower transmission is desired, the transmission can be reduced by increased NiCrOx thickness and/or reduced x value. Metal oxides and nitrides should have optical index in visible higher than 1.8, and can be nonconductive such as SiNx or conductive such as ZnAlOx in different example embodiments. A multiple layer structure can also be used to replace each metal oxide, nitride, or oxynitride, such as replacing TiOx by SiNx/TiOx or SnOx by SnOx/SiNx/ZnOx.

Figures 4, 5, 6, 7, 8:
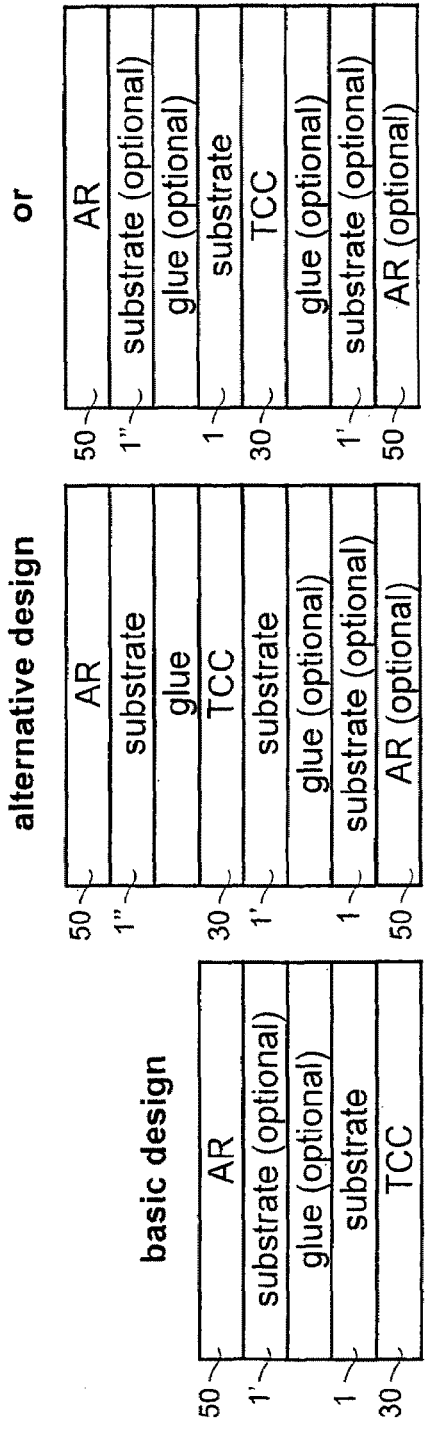
FIG. 4 is a listing of the layers of an EMI filter for a display panel (e.g. PDP panel) according to another example embodiment of this invention.
FIG. 5 is a listing of the layers of an example antireflection (AR) coating which may optionally be used in conjunction with an EMI coating in certain example embodiments of this invention.
FIG. 6 is a cross sectional view of the EMI filter (TCC) (of any embodiment of this invention), front cover glass, and optional AR coating for use at the front of a PDP panel according to an example embodiment of this invention.
FIG. 7 is a cross sectional view of the EMI filter (TCC) (of any embodiment of this invention), front cover glass, and a pair of optional AR coatings for use at the front of a PDP panel according to another example embodiment of this invention.
FIG. 8 is a cross sectional view of the EMI filter (TCC) (of any embodiment of this invention), front cover glass, and a pair of optional AR coatings for use at the front of a PDP panel according to another example embodiment of this invention.
Figure 10:
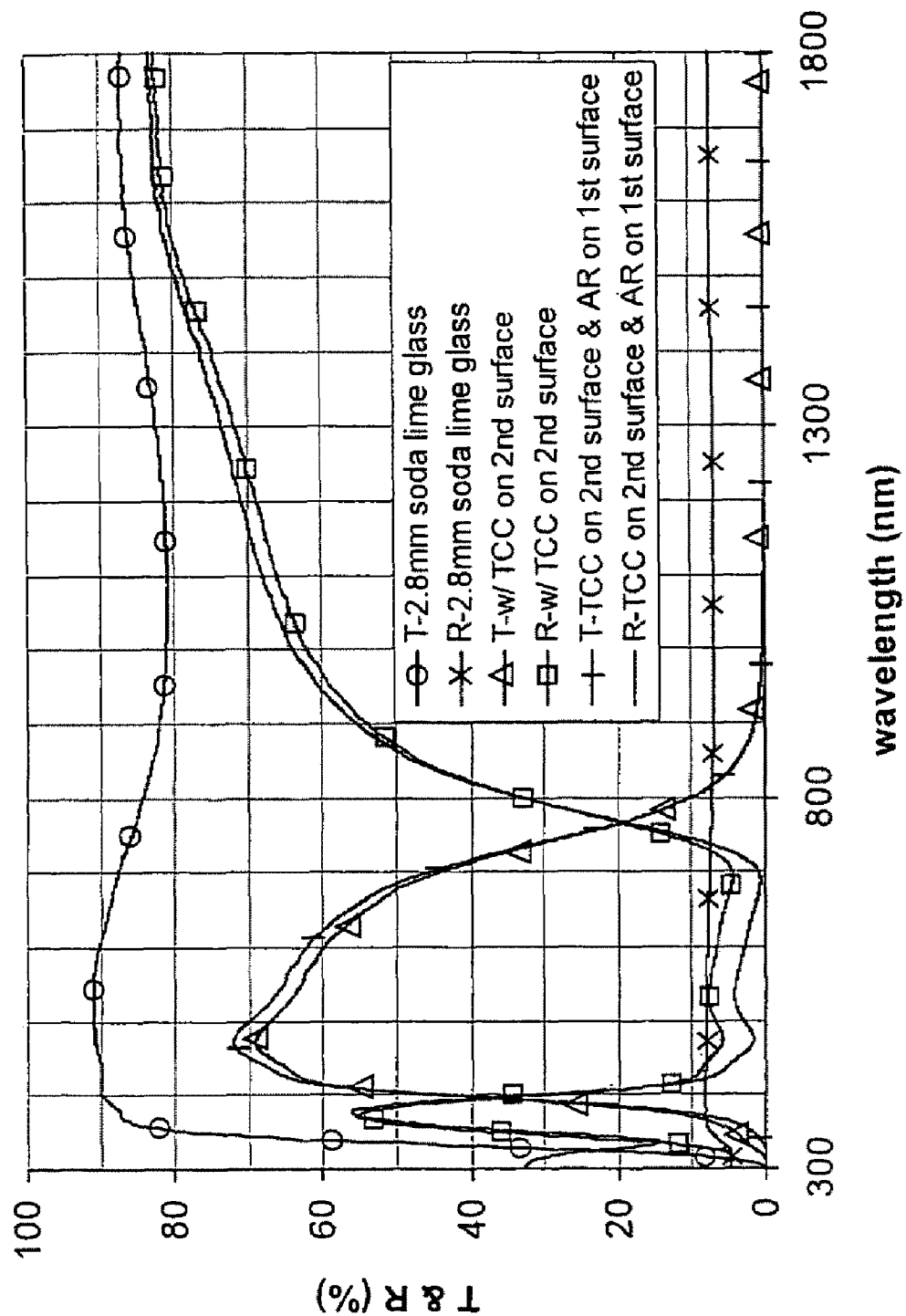
FIG. 10 is a transmission (T)/reflectance (R) vs. wavelength graph illustrating optical characteristics of the filters according to various example embodiments of this invention.

Referring to FIG. 5, a broad band visible antireflection (AR) coating 50, such as the one described in FIG. 5 or any other suitable AR coating, can be applied on the opposite surface of the substrate 1 (see FIGS. 6-8) and/or laminated atop of the TCC 30 (see FIGS. 7-8) to further enhance the optical performance of the Ag based EMI protection coating 30 in certain example embodiments of this invention. Examples of using this Ag based TCC coating for display applications are shown in FIGS. 6-8. As explained above, the various FIG. 6-8 filter structures may be used in place of 100 or 100' in the PDP device of FIG. 6 of US 2006/0083938, in example applications of this invention. Note that in FIGS. 6-8, optional additional substrate(s) 1', 1'' may be glass or plastic, and the glue may be any suitable adhesive or the like. For example, in one example, a TCC coating 30 having 4 layers of Ag (as shown in FIGS. 1(*a*), 3 and 4) is used as part of cover glass 1 structure for outdoor display applications, and FIGS. 6-8 illustrate example designs of this cover glass structure with the optional possibility of using it together with an AR coating 50. Optical performance of example is summarized in FIG. 9 when TCC 30 (e.g., see FIG. 4, or FIG. 1) and AR (e.g., see FIG. 5) are coated on opposite surfaces of the substrate 1. Transmission and reflection spectra details are shown in FIG. 10. As with other embodiments herein, the TCC EMI filter coating 30 provides the following functions/advantages: reduces damage from EMI radiation through highly conductive Ag layers, block significant amounts of NIR and IR radiation from outdoor sunlight to reduce panel temperature, and enhances contrast ratio through reduced reflection.

Figures 11, 12:
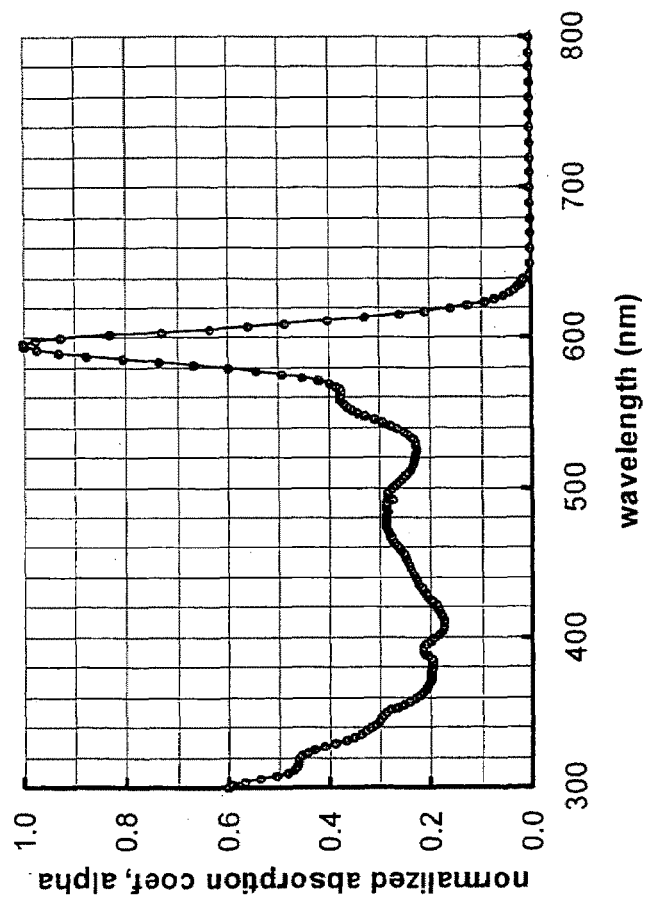
FIG. 11 is a graph illustrating normalized absorption spectrum of example optional pink dye which may be used in certain example embodiments of this invention.
FIG. 12 is a table listing example optical characteristics of filter structures of certain example embodiments of this invention which include the use of dye.
Figure 13:
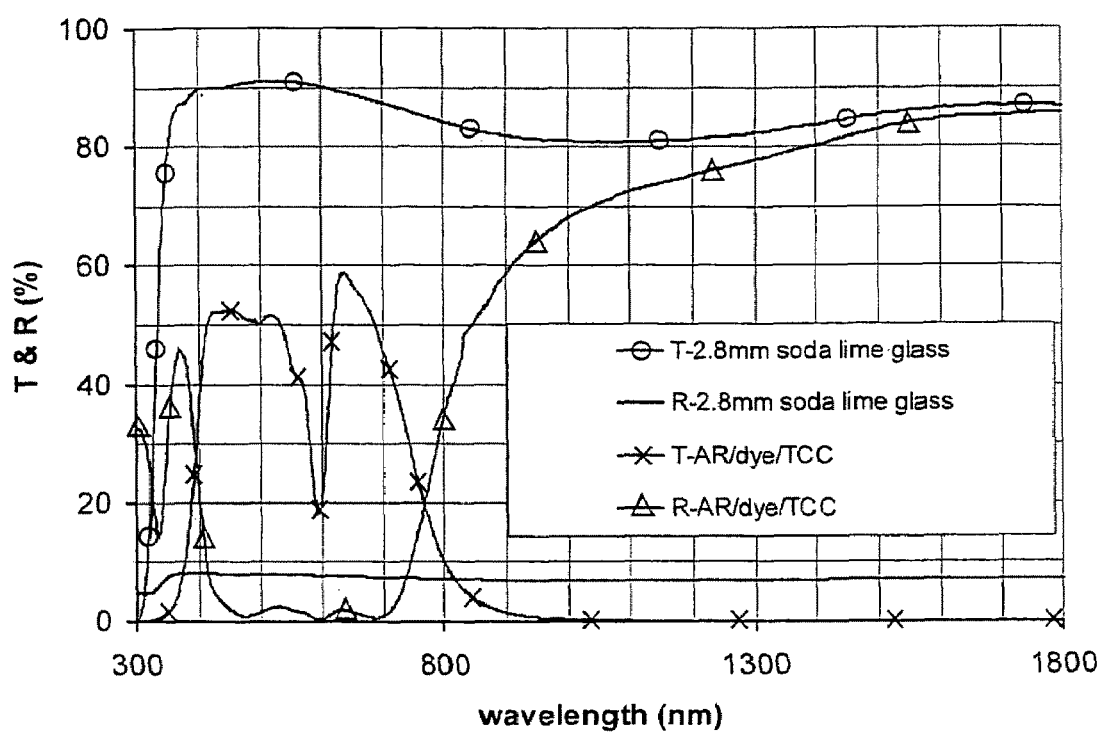
FIG. 13 is a transmission (T)/reflectance (R) vs. wavelength graph illustrating optical characteristics of the filters according to various example embodiments of this invention which include the use of dye.

Referring to FIGS. 11-13, another example of this invention is similar to the embodiments of FIGS. 1-10, but also includes an extra dye(es) based absorption layer(s) to reduce transmission at about 595 nm (as shown in FIG. 11) to improve color neutrality for plasma display applications. In certain example embodiments, the dye is for absorbing at selected wavelength ranges, but not other ranges. For example in certain example embodiments, the dye may absorb light proximate 595 nm (e.g., see FIG. 11) in order to improve color characteristics of PDP devices. The dye inclusive layer (not shown) can be introduced into one or more locations, such as between AR coating 50) and substrate (1), or between TCC 30 and substrate 1, or between TCC 30 and the glue layer, or embedded in the glue layer or substrate(s) 1 (see FIGS. 6-8). The optical performance of an example of this dye inclusive embodiment for PDP devices is shown in FIG. 12, and transmission and reflection spectra of an example of this embodiment are shown in FIG. 13. In this cover glass structure, the TCC coating 30 provides the following functions: block the emitting of EMI radiation from plasma panel by highly conductive Ag layers, block NIR and IR radiation from sunlight to reduce panel temperature for outdoor usage, enhance contrast ratio through reduced reflection, and block the emitting of NIR (850-950 nm) radiation from plasma panel to avoid the interference to nearby electronics.

FIGS. 14-19 are cross sectional views of EMI filters for display panels (e.g. PDP panels) according to other example embodiments of this invention. These embodiments may be heat treatable, and may be designed for different sheet resistances (Rs). The EMI filter coatings of these embodiments may be heat treated in a typical or conventional tempering furnace, so that the glass substrate 1 is tempered when the coated article is heat treated. Suitable black and/or silver frits can be applied to and fired onto the coated surface with good adhesion and no significant damage to the coated surface.

FIGS. 14-19 are heat treatable (HT) versions and the coatings of these embodiments can survive heat treatment at temperature of from about 500-750 degrees C. (more preferably from about 520-650 degrees C.) while still maintaining an acceptable haze value following HT; and the coatings of these embodiments can have a sheet resistance (Rs) of no more than about 1.3 or 1.2 ohms/square (more preferably no more than about 1.0 or 0.90 ohms/square), and a visible transmission of at least about 60% (more preferably at least about 62 or 63%), following HT. In certain example embodiments, the coated articles of these embodiments have a haze value of no more than about 3 (more preferably no more than about 2.0 or 1.0) following HT. In the FIG. 14-19 embodiments, silicon nitride based layer(s) 3 and/or 3a (and possibly 3a') may be Si-rich as discussed above in certain example embodiments, and NiCr oxided based layer(s) 31 and/or 41 is/are only partially oxided in certain example embodiments. The use of such Si-rich silicon nitride and only partially oxiding at least one of the NiCrOx based layers results in a coated article that is better able to withstand HT while maintaining suitable visible transmission and haze values following HT. In certain example embodiments, NiCrOx based layer 41 is less oxided than are one, two or all three of NiCrOx based layers 11, 21 and/or 31. In certain example embodiments, one or both of NiCrOx based layer(s) 31 and/or 41 is/are less oxided than are one or both of NiCrOx based layer(s) 11 and/or 21; it has been found that this helps provide for a more heat treatable coating with better thermal stability upon HT. In the FIG. 14-19 embodiments, metal oxide (e.g., tin oxide) based layer 13a (and 13a') is provided for improving adhesion between the silicon nitride based layer 3a and zinc oxide based layer 17.

While the materials shown for the various layers in the drawings are preferred materials in certain example embodiments of this invention, they are not intended to be limited unless expressly claimed. Other materials may be used to replace materials shown in the drawings in alternative example embodiments of this invention. Moreover, certain layers may be removed, and other layers added, in alternative embodiments of this invention. Likewise, the illustrated thicknesses also are not intended to be limiting unless expressly claimed.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A plasma display device comprising:
   a plasma display panel;
   an electromagnetic interference (EMI) filter provided at a front portion of the plasma display panel, the EMI filter including an EMI coating supported by a glass substrate, the EMI coating including the following layers moving away from the glass substrate:
   a first layer comprising silicon nitride;
   a first high index layer having a refractive index (n) of at least about 2.2;
   a first layer comprising zinc oxide;
   a first EMI shielding layer comprising silver contacting the first layer comprising zinc oxide;
   a first layer comprising an oxide of Ni and/or Cr contacting the first EMI shielding layer comprising silver;
   a first metal oxide layer;
   a second layer comprising zinc oxide;
   a second EMI shielding layer comprising silver contacting the second layer comprising zinc oxide;
   a second layer comprising an oxide of Ni and/or Cr contacting the second EMI shielding layer comprising silver;
   a second metal oxide layer;
   a third layer comprising zinc oxide;
   a third EMI shielding layer comprising silver contacting the third layer comprising zinc oxide;
   a third layer comprising an oxide of Ni and/or Cr contacting the third EMI shielding layer comprising silver;
   a third metal oxide layer;
   an overcoat layer; and
   wherein the third EMI shielding layer comprising silver is thicker by at least 2 nm than the first EMI shielding layer comprising silver.

2. The plasma display device of claim 1, wherein the first high index layer comprises an oxide of titanium.

3. The plasma display device of claim 1, wherein the glass substrate and the EMI coating combined have a visible transmission of at least 55%, more preferably at least 60%.

4. The plasma display device of claim 1, wherein the third EMI shielding layer comprising silver is thicker than both the first and second EMI shielding layers comprising silver.

5. The plasma display device of claim 1, further comprising a second high index layer having a refractive index of at least 2.2, the second high index layer comprising an oxide of titanium and being located between the second and third EMI shielding layers.

6. The plasma display device of claim 5, where no high index layer comprising an oxide of titanium is located between the first and second EMI shielding layers.

7. A plasma display device comprising:
a plasma display panel;
an electromagnetic interference (EMI) filter provided at a front portion of the plasma display panel, the EMI filter including an EMI coating supported by a glass substrate, the EMI coating including the following layers moving away from the glass substrate:
a first layer comprising zinc oxide;
a first EMI shielding layer comprising silver contacting the first layer comprising zinc oxide;
a first layer comprising an oxide of Ni and/or Cr contacting the first EMI shielding layer comprising silver;
a second layer comprising zinc oxide;
a second EMI shielding layer comprising silver contacting the second layer comprising zinc oxide;
a second layer comprising an oxide of Ni and/or Cr contacting the second EMI shielding layer comprising silver;
a third layer comprising zinc oxide;
a third EMI shielding layer comprising silver contacting the third layer comprising zinc oxide;
a third layer comprising an oxide of Ni and/or Cr contacting the third EMI shielding layer comprising silver;
an overcoat layer;
wherein the third EMI shielding layer comprising silver is thicker by at least 2 nm than the first and/or second EMI shielding layers comprising silver.

8. The plasma display device of claim 7, wherein the third EMI shielding layer comprising silver is at least 1 nm thicker (more preferably at least 2 nm thicker, and most preferably at least 3 nm thicker) than the first and/or second EMI shielding layers comprising silver.

9. The plasma display device of claim 7, wherein the glass substrate and the EMI coating combined have a visible transmission of at least 55%, more preferably at least 60%.

10. The plasma display device of claim 7, further comprising a high index layer comprising an oxide of titanium located between the glass substrate and the first EMI shielding layer, but where no high index layer comprising an oxide of titanium is located between the first and second EMI shielding layers.

11. An EMI filter for a display device, the EMI filter comprising:
an EMI coating supported by a glass substrate, the EMI coating including the following layers moving away from the glass substrate:
a first layer comprising zinc oxide;
a first EMI shielding layer comprising silver contacting the first layer comprising zinc oxide;
a first layer comprising an oxide of Ni and/or Cr contacting the first EMI shielding layer comprising silver;
a second layer comprising zinc oxide;
a second EMI shielding layer comprising silver contacting the second layer comprising zinc oxide;
a second layer comprising an oxide of Ni and/or Cr contacting the second EMI shielding layer comprising silver;
a third layer comprising zinc oxide;
a third EMI shielding layer comprising silver contacting the third layer comprising zinc oxide;
a third layer comprising an oxide of Ni and/or Cr contacting the third EMI shielding layer comprising silver;
an overcoat layer;
wherein the third EMI shielding layer comprising silver is thicker by at least 2 nm than the first and/or second EMI shielding layers comprising silver.

12. A plasma display device comprising:
a plasma display panel;
an electromagnetic interference (EMI) filter provided at a front portion of the plasma display panel, the EMI filter including an EMI coating supported by a glass substrate, the EMI coating including the following layers moving away from the glass substrate:
a first layer comprising silicon nitride;
a first layer comprising zinc oxide;
a first EMI shielding layer comprising silver contacting the first layer comprising zinc oxide;
a first layer comprising an oxide of Ni and/or Cr contacting the first EMI shielding layer. comprising silver;
a first metal oxide layer;
a second layer comprising zinc oxide;
a second EMI shielding layer comprising silver contacting the second layer comprising zinc oxide;
a second layer comprising an oxide of Ni and/or Cr contacting the second EMI shielding layer comprising silver;
a second metal oxide layer;
third layer comprising zinc oxide;
a third EMI shielding layer comprising silver contacting the third layer comprising zinc oxide;
a third layer comprising an oxide of Ni and/or Cr contacting the third EMI shielding layer comprising silver;
a third metal oxide layer;
an overcoat layer; and
wherein the first layer comprising silicon nitride comprises $Si_xN_y$ layer(s), where x/y is from 0.85 to 1.2, and wherein the third EMI shielding layer comprising silver is thicker by at least 2 nm than both the first and second EMI shielding layers comprising silver.

13. The device of claim 12, further comprising another layer comprising silicon nitride located between at least the first and second EMI shielding layers, wherein the another layer comprising silicon nitride comprises $Si_xN_y$ layer(s), where x/y is from 0.85 to 1.2.

* * * * *